United States Patent [19]
Volluet et al.

[11] 4,419,637
[45] Dec. 6, 1983

[54] MAGNETOSTATIC WAVE DIOPTRIC DEVICE

[75] Inventors: Gérard Volluet; Pierre Hartemann, both of Paris, France

[73] Assignee: Thomson-CSF, Paris, France

[21] Appl. No.: 343,752

[22] Filed: Jan. 28, 1982

[30] Foreign Application Priority Data

Feb. 13, 1981 [FR] France ............................. 81 02865

[51] Int. Cl.³ ........................ H03H 9/30; H03H 9/40
[52] U.S. Cl. .................................. 333/147; 333/153; 333/156
[58] Field of Search .................. 333/150–155, 333/193–196, 24.1, 28 R, 147, 148, 156; 331/107 A; 330/4.6, 5.5; 310/313 R, 313 A, 313 B, 313 C, 313 D

[56] References Cited

U.S. PATENT DOCUMENTS

| | | | |
|---|---|---|---|
| 4,318,061 | 3/1982 | Cástera et al. | 333/153 X |
| 4,336,514 | 6/1982 | Paige | 333/153 X |

FOREIGN PATENT DOCUMENTS

| | | |
|---|---|---|
| 21878 | 1/1981 | European Pat. Off. . |
| 2249491 | 5/1975 | France . |
| 2250230 | 5/1975 | France . |

OTHER PUBLICATIONS

Adam et al.—"Magnetostatic Wave Devices Move Microwave Design into Gigahertz Realm", Electronics/May 8, 1980; pp. 123–127.
Owens et al.—"Surface Acoustic Wave Devices: A Status Report", Proceedings of 1979 ISCAS, pp. 567–571.

*Primary Examiner*—Marvin L. Nussbaum
*Attorney, Agent, or Firm*—Cushman, Darby & Cushman

[57] ABSTRACT

A magnetostatic wave device in which waves propagate in a layer of magnetic material grown on a nonmagnetic crystalline substrate with a grating arranged in the wave path for modifying propagation velocity. The grating is formed by ion implantation without removal of magnetic material so coupling with spin modes is avoided.

14 Claims, 8 Drawing Figures

MAGNETOSTATIC WAVE DIOPTRIC DEVICE

BACKGROUND OF THE INVENTION

The present invention relates to magnetostatic wave devices comprising a layer or wafer of magnetic material exposed to an external magnetic field. When the propagation velocity of magnetostatic waves is modified within clearly defined ranges, as in optics, diopters are formed, which can partly reflect, refract or guide these waves. By means of a conductive strip traversed by a high frequency alternating current, it is possible to excite spin wave and magnetostatic wave modes in a polarized magnetic layer.

The selective excitation of magnetostatic waves makes it possible to obtain devices having a certain similarity with other known devices, such as elastic surface wave devices. However, the propagation of magnetostatic waves can be accompanied by undesirable absorption phenomena due to a possible residual coupling with the spin wave moves. On producing a magnetic wafer or layer of adequate thickness, obtainable for example by epitaxy on a non-magnetic substrate, it is possible to exchange magnetostatic waves between microstrip transducers without being disturbed by the spin wave spectrum. This procedure has given rise to magnetostatic wave devices able to operate in a wide frequency band.

In wave propogation devices, various solutions have been proposed for producing a propagation velocity change in selected regions of a substrate traversed by waves. These solutions make it possible to bring about guidance by total reflection, focusing by refraction or a simple wave reflection.

In the case of magnetostatic waves, such a wave velocity change can be obtained by hollowing out predetermined regions of the surface of the magnetic wafer or layer. The thickness reduction of the magnetic layer reduces the propagation velocity. The disadvantage of this procedure is that the thinner portions aid the excitation of spin wave modes due to interference existing in the etched areas. In order to bring about a wave velocity change, which does not give rise to the excitation of spin waves, it has been proposed to localize the regions in which this change is to take place, by metallically coating the magnetic wafer or layer. This solution leads to an increase in the propagation velocity, but has the disadvantage of introducing high transmission losses. However, it is possible to reduce the attentuating effect of a metallic coating by removing it from the magnetic layer, but this improvement necessitates a more complex production process. In order to obviate the aforementioned disadvantages, the invention proposes using ion implantation for locally reducing the magnetic properties of a magnetic medium. The absence of the hollowing out process and the elimination of a metallic coating make it possible to obtain, by reducing the effective thickness, a reduction in the propagation velocity without any excitation of spin waves and without any transmission attenuation.

BRIEF SUMMARY OF THE INVENTION

The invention relates to a magnetostatic wave dioptric device comprising a magnetic medium, means being provided for electrically exciting the waves and, on the path of said waves, the medium has at least on region in which the propagation velocity of the waves is modified, wherein the region is a region which has undergone ion implantation.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

It is known that a wave which crosses the limit separating two propagation media is reflected and refracted. In the case of magnetostatic waves, the change of medium is linked with a deterioration of the magnetic layer or an interaction of the latter with an adjacent conductive structure. Thus, a magnetostatic wave dioptric device can involve a partial reflection, a total reflection or a refraction phenomenon. These three effects are applied to three magnetostatic wave types liable to propagate on the surface of a ferrimagnetic wafer. Within the general scope, interest is attached to regions which introduce an index jump and the thus formed diopters have a reflecting and refringent action on the magnetostatic waves.

Figure 1:
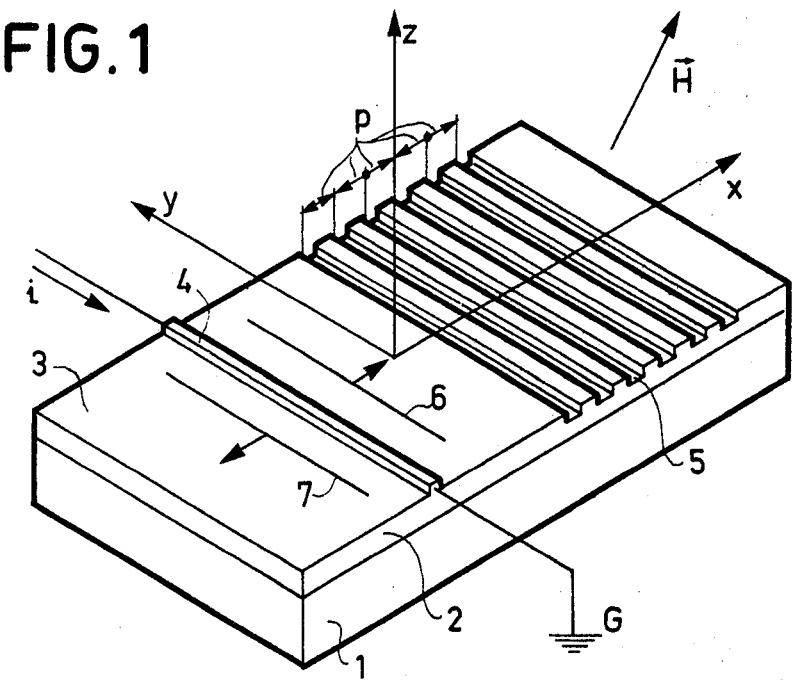
FIG. 1 is a known magnetostatic wave device.

FIG. 1 is an isometric view of a magnetostatic wave dioptric device involving selective reflection by a periodic network or grating. In a per se known manner and as a non-limitative example, said device comprises a 111 oriented gadolinium and gallium garnet (GGG) non-magnetic substrate 1 and an yttrium and iron garnet (YIG) magnetic layer 2 epitaxied on the substrate. The thickness of layer 2 can vary between a few microns and a few dozen microns. Layer 2 is subject to an external magnetic field $\vec{H}$, whose orientation with respect to the system of axes x,y,z in FIG. 1 defines the magnetostatic wave modes liable to propagate.

For example, it is possible to have forward volume magnetostatic waves if the field H is parallel to axis z. In this case, the propagation is isotropic. It is also possible to have backward volume magnetostatic waves if the field H is oriented parallel to axis x along which these waves propagate. Finally, if field H is oriented in accordance with axis y, magnetostatic surface waves are propagated in the direction of axis x.

FIG. 1 shows a magnetostatic wave transducer constituted by a conductive strip 4 deposited on the surface 3 of magnetic layer 2.

This conductive strip, oriented in accordance with axis y is connected by one of its ends to an earth plane G. An alternating current 6 is injected by the other end of strip 4 in order to excite in magnetic layer 2 magnetostatic waves, whose wave fronts 6 and 7 move away from the conductive strip 4.

In order to selectively reflect wave front 6 a grating of parallel grooves 5 having a uniform spacing p is formed in layer 2. Each of the grooves 5 is obtained by removing material by chemically etching magnetic layer 2 or by hollowing it out by ionic machining.

Figure 2:
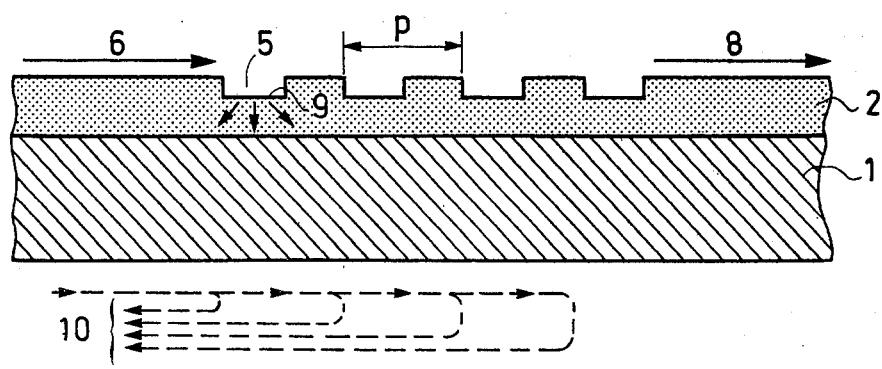
FIG. 2 a part sectional view of the device of FIG. 1.

FIG. 2 is a part section of the device of FIG. 1 showing the cross-section of grooves 5, the spacing p of the reflecting grating and the incidence direction G of the magnetostatic waves. Downstream of the grating of grooves 5, a fraction 8 of the energy of the magnetostatic waves is propagated in the magnetic layer 2. A series of dotted-line paths in FIG. 2 illustrates the reflecting effect of the grating of grooves 5. The fraction 10 of the energy reflected by the grating is maximum when the spacing p is equal to the wavelength $\lambda$ of the magnetostatic waves received under a normal incidence. In the case of an oblique incidence, the maximum reflecting power occurs for an equiphase excitation of the difference lines 5 of the system. Thus, for an incidence of 45°, the reflection maximum takes place when the spacing is equal to $\lambda/\sqrt{2}$ if the magnetostatic wave is a forward volume wave.

Figure 3:
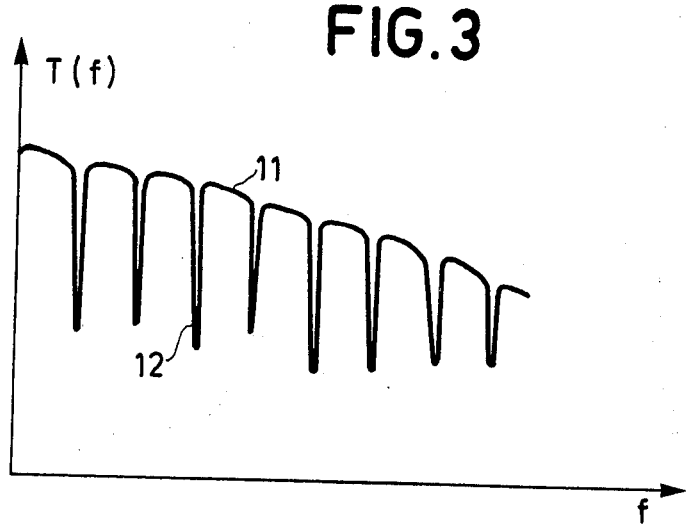
FIG. 3 a magnetostatic wave transmission characteristic allocated with absorption modes by spin wave coupling.

On collecting the radiation 8 transmitted by the grating of lines 5 or the radiation 10 reflected on a conductive strip identical to strip 4, a current i' is induced by an inverse transducer effect and on measuring the ratio T=i'/i at different frequencies f, it is possible to plot the graph shown in FIG. 3. Curve 11 includes a series of peaks 12 indicating a coupling with the spin wave modes. This coupling can be attributed to the bottom 9 of grooves 5 in the manner machined. The existence of peaks 12 implies a severe limitation of the frequency band in which it is possible to utilize the selective reflection properties of a grating or any other property based on diopters for magnetostatic waves.

Experience has shown that the production of diopters in a magnetic wafer or layer does not suffer from the aforementioned deficiency, when the surface is covered with metallic regions in the form of bands or blocks. However, the presence of these metallic regions gives rise to high transmission losses.

To obviate this disadvantage, the invention is directed at forming diopters by ion implantation in layer 2. Experience has shown that this procedure makes it possible to obtain low insertion losses and an insignificant coupling with respect to the spin wave modes.

Figure 4:
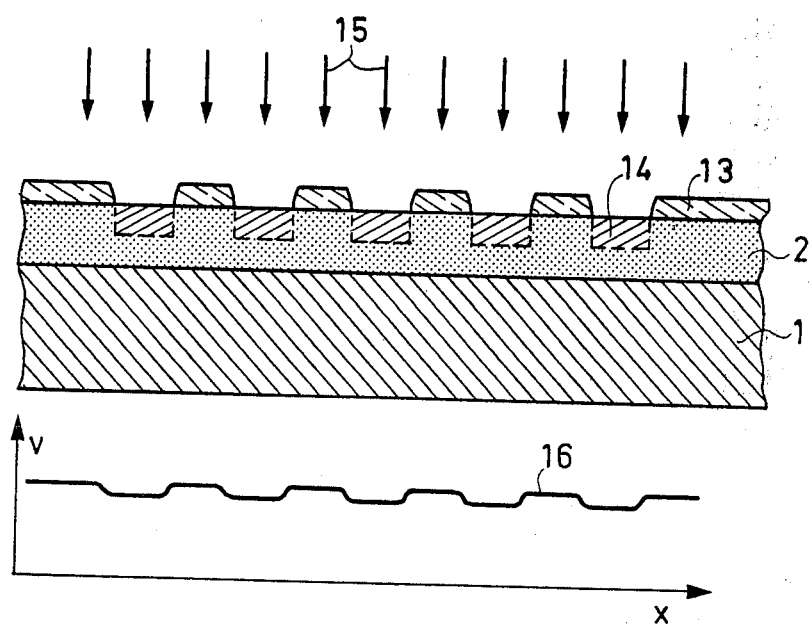
FIG. 4 a sectional view of a selective reflection grating according to the invention.
Figure 6:
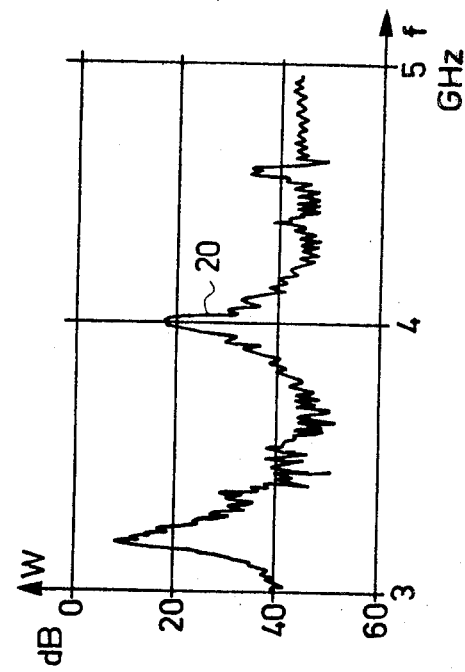
FIG. 6 the insertion losses obtained during an exchange by magnetostatic waves with right angle return by an implanted grating.

This procedure is illustrated in FIG. 4, which shows in the manner of a non-limitative exemplified embodiment a resin mask 13 deposited on the surface of magnetic layer 2. Ionic bombardment represented by arrows 15 ensures the ion implantation of regions 14, whose extent is defined by orifices in the resin mask 13. The depth of the regions 14 is dependent on the energy of the ions and their nature. The resin mask 13 is produced by known photolithographic procedures and can be eliminated after ion implantation.

It can be seen that the implanted regions 14 of layer 2 are degenerated from the magnetic standpoint and behave as amorphous areas. The transformation of the magnetic layer occurring perpendicular to the implanted areas produces the spatial modulation of propagation velocity v of the magnetic waves, in the manner illustrated by curve 16. Ion implantation does not in fact give rise to any measurable relief on the surface of layer 2 and does not aid coupling with the spin wave modes. The depth of areas 14 which furthermore have been made amorphous is approximately 1 thousand to a few thousand angstroms and the magnetic material has a greatly reduced magnetization there. The implanted areas can be locally paramagnetic. The reduction of the propagation velocity is on a par with the effective thickness of the magnetic layer, but the local reduction of this effective thickness by implantation does not lead to the undesired coupling referred to in connection with etching by removing of material either chemically or ionically. It is therefore possible to obtain in a magnetic field diopters with low insertion losses, whilst avoiding producing spin mode resonances.

As a non-limitative example, the effectiveness of ion implantation has been proved for performing a selective reflection of forward volume magnetostatic waves.

On passing from a monocrystalline ferrimagnetic layer of yttrium and iron garnet epitaxied in the liquid phase on a gadolinium and gallium garnet, a masking resin was deposited, which was specifically resin 1350H produced by Messrs. SHIPLEY. The thus masked layer 2 had a thickness of 23.5 $\mu$m. By insolation and development a grating of 15 rectangular windows was formed in the resin. Each window, with a length of 7 mm and a width of 50 $\mu$m was separated from its neighbours by 50 $\mu$m of resin. The implantation conditions were as follows:

nature of the ion: $He^{4+}$
acceleration energy: 100 KeV
dose: $10^{16}$ ions/cm$^2$
current density: 0.8 $\mu$A/cm$^2$.

Figure 7:
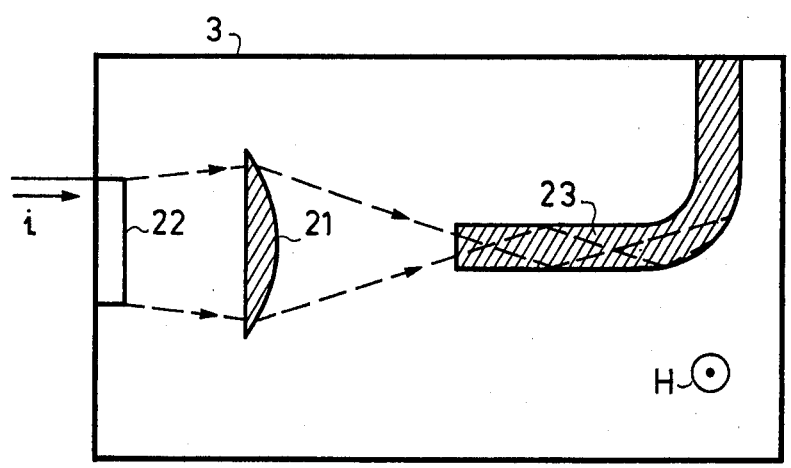
FIG. 7 an implanted magnetic layer with lens effect and confinement in a waveguide.

A transmission test between an emitter microstrip and a receiver microstrip performed by selective reflection at 45° led to the graph of FIG. 7 giving in decibels the insertion losses W as a function of the frequency f of the magnetostatic waves. The region 20 of the curve clearly shows this selective reflection about frequency 4 GHz with a remarkable absence of spin mode resonances.

Figure 5:
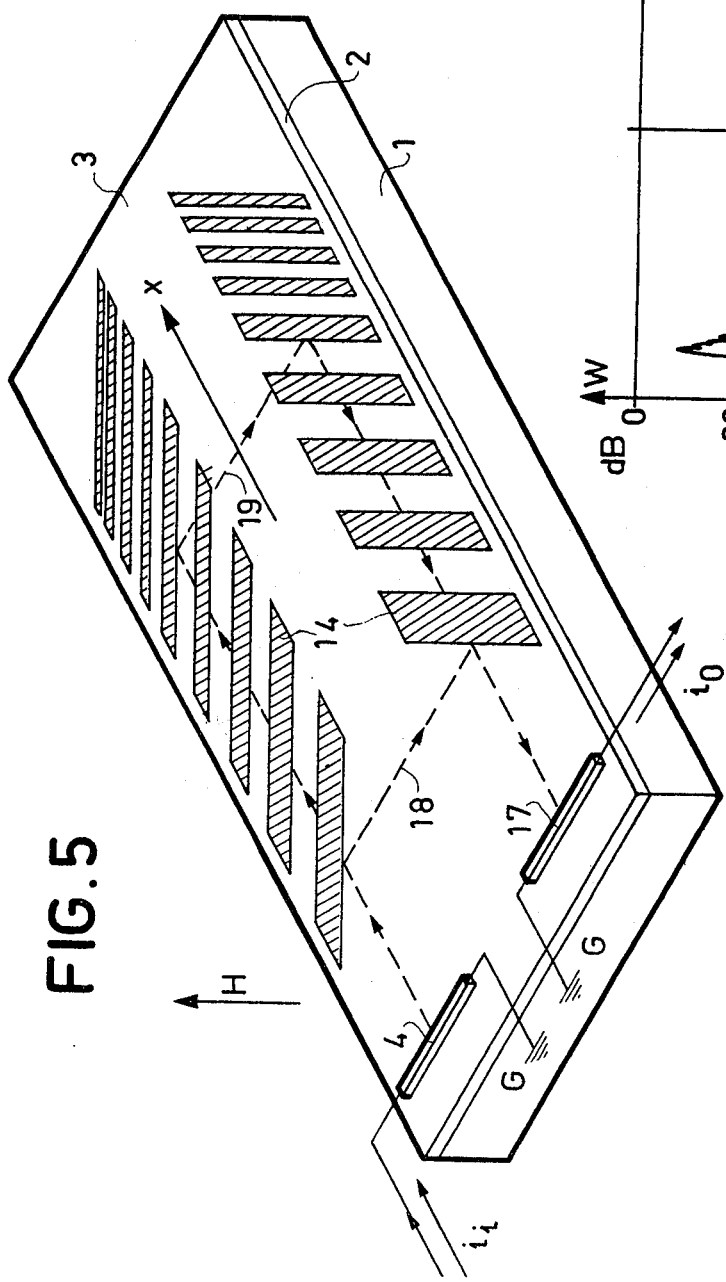
FIG. 5 an isometric view of a dispersive delay line according to the invention.

FIG. 5 shows a dispersive line based on the selective reflection of magnetic waves. It comprises a magnetic layer 2 epitaxied on a substrate 1. An external magnetic field H polarizes layer 2 perpendicular to its surface. Magnetostatic waves are excited in direction x by a current $i_2$ circulating in microstrip 4. A microstrip 17 intercepts the magnetostatic waves after two selective reflections taking place on two sets of implanted regions 14. To this end, regions 14 form two grating of lines inclined by 45° in opposite directions with respect to the propagation direction x. The spacings of the lines vary in the same way in direction x, so that the transmission delay between current $i_o$ and current $i_f$ is a function of the frequency. In a typical case of the dispersion characteristic to be realised, the procedure can be such that at low frequency the magnetostatic waves describe a shorter path 18 than path 19 taken by the higher frequency waves. It should be noted that the lines of the grating can be subdivided into strings of dots.

FIG. 7 illustrates an application of the invention to the focusing and guidance of magnetostatic waves. The upper face 3 of the magnetic layer is located in the plane of the drawing and the external magnetic field H is directed perpendicular to said plane.

The magnetostatic waves are excited by a microstrip 22 traversed by the alternating current i. It radiates to the right rectilinear wave fronts received by an implanted region 21 having a lenticular shape. The slowering undergone by the magnetostatic waves crossing region 21 leads to their focusing at the entrance to another implanted region 23. As the waves propagate more slowly within region 23, they can undergo a total reflection on two equidistant diopters, which bound or limit said implanted region. Thus, region 23 serves as a waveguide. The curvature of waveguide 23 has been greatly exaggerated due to lack of space.

Region 23 can have a non-uniform width. Thus, it is possible to provide a splayed entrance similar to a funnel. Region 23 can also be given a Y-shape, i.e. a star-shaped arrangement with several branches. By connecting two Y-shaped structures by two branches, it is possible to obtain an integrated interferometer with two branches. The invention also applies to zone lenses and to Fresnel lenses.

Figure 8:
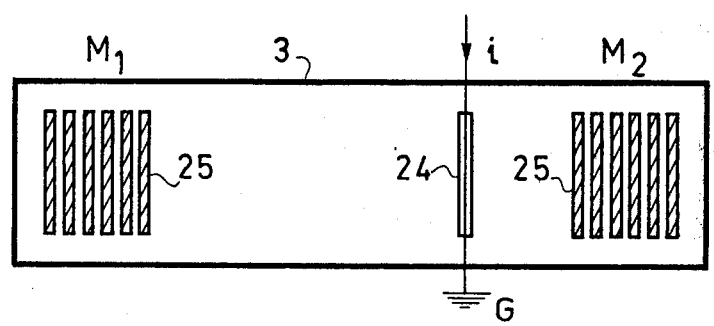
FIG. 8 an implanted layer making it possible to form a mirror cavity resonator.

FIG. 8 shows a cavity resonator with mirrors $M_1$ and $M_2$. The mirrors are constituted by grids 25 implanted on surface 3 of the magnetic layer. Within the cavity is shown a microstrip 24, whose impedance depends on the resonance modes of the cavity. It is possible to connect microstrip 24 to an electric circuit with a negative resistance in order to obtain an oscillator. The grids 25 can occupy the whole space available and need only form a single grid grating. In this case, microstrip 24 can be fitted between two implanted areas. It is also possible to place two microstrips in the cavity and in this case the transfer function between these two transducers has a maximum at the resonant frequency.

The invention applies to any configuration realising reflecting or refringent diopters on the surface of a magnetic medium. Ion implantation leads to a local magnetization reduction which does not impair the surface and consequently does not aid coupling with interfering modes. The propagation losses are negligible in the implanted regions and the effect of the implantation can be adjusted by influencing the choice of ions, the impact energy and the dose received. As the magnetic layer surface is substantially planar, it is possible for conductive microstrips to overlap an implanted region. This possibility makes it possible to weight the amplitude of the emissivity of the microstrips, due to the reduction of the magnetic properties. Two non-contiguous regions can define an intermediate region which has retained its magnetic properties and microstrips can overlap these three regions so as to define areas having differentiated emissivities. Short-circuit microstrips can bring about a coupling between the two implanted waveguides. When there are no microstrips, two close-together waveguides can form a directional coupler.

What is claimed is:

1. A device for controlling the propagation of magnetostatic waves in the extent of a layer of magnetic material of predetermined thickness epitaxially grown on a non-magnetic crystalline substrate, said device comprising: biasing means for applying a magnetic field to said layer, transducer means for exciting said magnetostatic waves in said layer, and arranged in the path of the magnetostatic waves emerging from said transducer means, at least one ion implanted region wherein the propagation velocity of said magnetostatic waves is modified by local reduction of the effective thickness of said layer; the surface of said layer remaining substantially planar, and said effective thickness reduction arising from degenerated magnetic properties induced without removal of said magnetic material.

2. A device according to claim 1, including at least one group of implanted regions forming a grating with selective reflection.

3. A device according to claim 2, wherein this grating forms a magnetostatic wave resonator.

4. A device according to claim 2, including at least two selective reflection gratings which exchange the magnetostatic waves.

5. A device according to claim 4, wherein the exchange takes place along a path perpendicular to the lines of the grating in order to form a resonator.

6. A device according to claim 4, wherein the exchange takes place in accordance with oblique paths with respect to the lines of the gratings.

7. A device according to claim 1, wherein said region forms a waveguide.

8. A device according to claim 1, wherein the waveguide has a plurality of branches.

9. A device according to claim 1, wherein the region has a configuration which modifies the wavefront shape of the magnetostatic waves.

10. A device according to claim 1, wherein the transducer means comprise at least one conductive microstrip radiating in the direction of the said region.

11. A device according to claim 1, wherein the transducer means comprise at least one conductive microstrip covering the said region.

12. A device according to claim 1, wherein the magnetostatic waves are of one of the following modes: forward volume magnetostatic waves, backward volume magnetostatic waves and surface magnetostatic waves.

13. A device according to claim 2, wherein the lines of the grating are constituted by strings of dots.

14. A device as in claim 1 wherein the depth of said region is between one thousand and a few thousand angstroms.

* * * * *